United States Patent
Tignor

(10) Patent No.: US 7,847,602 B2
(45) Date of Patent: Dec. 7, 2010

(54) DIGITALLY CONTROLLED FREQUENCY GENERATOR

(75) Inventor: Todd S. Tignor, Charlottesville, VA (US)

(73) Assignee: Taitien Electronics Co., Ltd., Taipei (TW)

( * ) Notice: Subject to any disclaimer, the term of this patent is extended or adjusted under 35 U.S.C. 154(b) by 125 days.

(21) Appl. No.: 12/315,728

(22) Filed: Dec. 5, 2008

(65) Prior Publication Data

US 2010/0141303 A1    Jun. 10, 2010

(51) Int. Cl.
  *H03B 21/00* (2006.01)
(52) U.S. Cl. .................. 327/105; 327/106; 327/107; 327/113; 327/114; 331/176
(58) Field of Classification Search ......... 327/105–107, 327/113–114; 331/176
  See application file for complete search history.

(56) References Cited

U.S. PATENT DOCUMENTS

| | | | |
|---|---|---|---|
| 4,835,491 A | 5/1989 | Coster | 331/2 |
| 5,856,766 A * | 1/1999 | Gillig et al. | 331/176 |
| 6,522,177 B1 * | 2/2003 | Spampinato | 327/107 |
| 2005/0156634 A1 | 7/2005 | Coleman et al. | 327/16 |

FOREIGN PATENT DOCUMENTS

EP    0 278 140    8/1988

OTHER PUBLICATIONS

Extended European Search Report in EP09004811.7 dated Jul. 16, 2009.

* cited by examiner

*Primary Examiner*—Lincoln Donovan
*Assistant Examiner*—John W Poos
(74) *Attorney, Agent, or Firm*—McDonnell Boehnen Hulbert & Bergoff LLP

(57) ABSTRACT

A digitally controlled frequency generator includes an oscillator module for generating a first clock signal having an oscillating frequency, a programmable control module operable so as to generate a control signal corresponding to a desired frequency, and a direct digital frequency synthesizer coupled to the oscillator module and the programmable control module for receiving the first clock signal and the control signal therefrom, and for generating a second clock signal having the desired frequency based on the first clock signal from the oscillator module and the control signal from the programmable control module.

3 Claims, 3 Drawing Sheets

DIGITALLY CONTROLLED FREQUENCY GENERATOR

BACKGROUND OF THE INVENTION

1. Field of the Invention

The invention relates to a frequency generator, more particularly to a digitally controlled frequency generator.

2. Description of the Related Art

Referring to FIG. 1, a conventional frequency generator is shown to include a crystal oscillator 9 for generating a clock signal, an input module 81, and a control module 82 coupled to the crystal oscillator 9 and the input module 81. The crystal oscillator 9 includes a resonance chip 90 and a tuning circuit 91. The resonance chip 90 is fabricated through cutting, waxing, halfing, rounding, dewaxing and frequency lapping procedures. The tuning circuit 91 includes an inverter 911 and a plurality of variable load capacitors ($C_1$, $C_2$, $C_3$). The input module 81 is operable so as to output a control signal to the control module 82. The control module 82, such as a microcontroller, controls the crystal oscillator 9 in response to the control signal from the input module 81 to adjust capacitances of the load capacitors ($C_1$, $C_2$, $C_3$) so that the clock signal generated by the crystal oscillator 9 has a specified resonance frequency.

However, the frequency of the clock signal provided by the conventional frequency generator is fixed and cannot be adjusted by the user to obtain a desired frequency.

SUMMARY OF THE INVENTION

Therefore, an object of the present invention is to provide a digitally controlled frequency generator that can generate a clock signal having a desired frequency.

According to the present invention, a digitally controlled frequency generator comprises:

an oscillator module for generating a first clock signal having an oscillating frequency;

a programmable control module operable so as to generate a control signal corresponding to a desired frequency; and a direct digital frequency synthesizer coupled to the oscillator module and the programmable control module for receiving the first clock signal and the control signal therefrom, and for generating a second clock signal having the desired frequency based on the first clock signal from the oscillator module and the control signal from the programmable control module.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
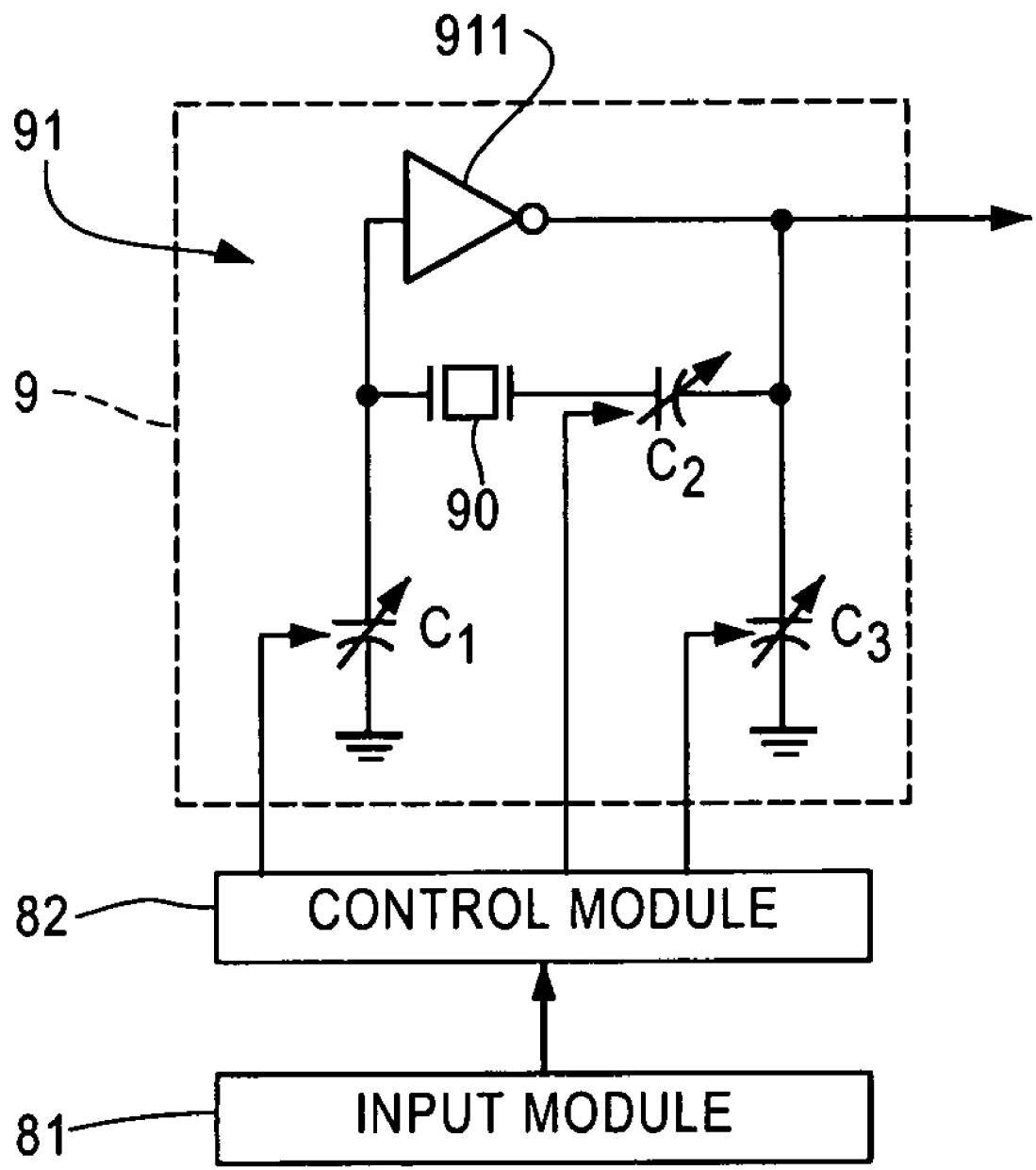
FIG. 1 is a schematic electrical circuit block diagram of a conventional frequency generator.
Figure 2:
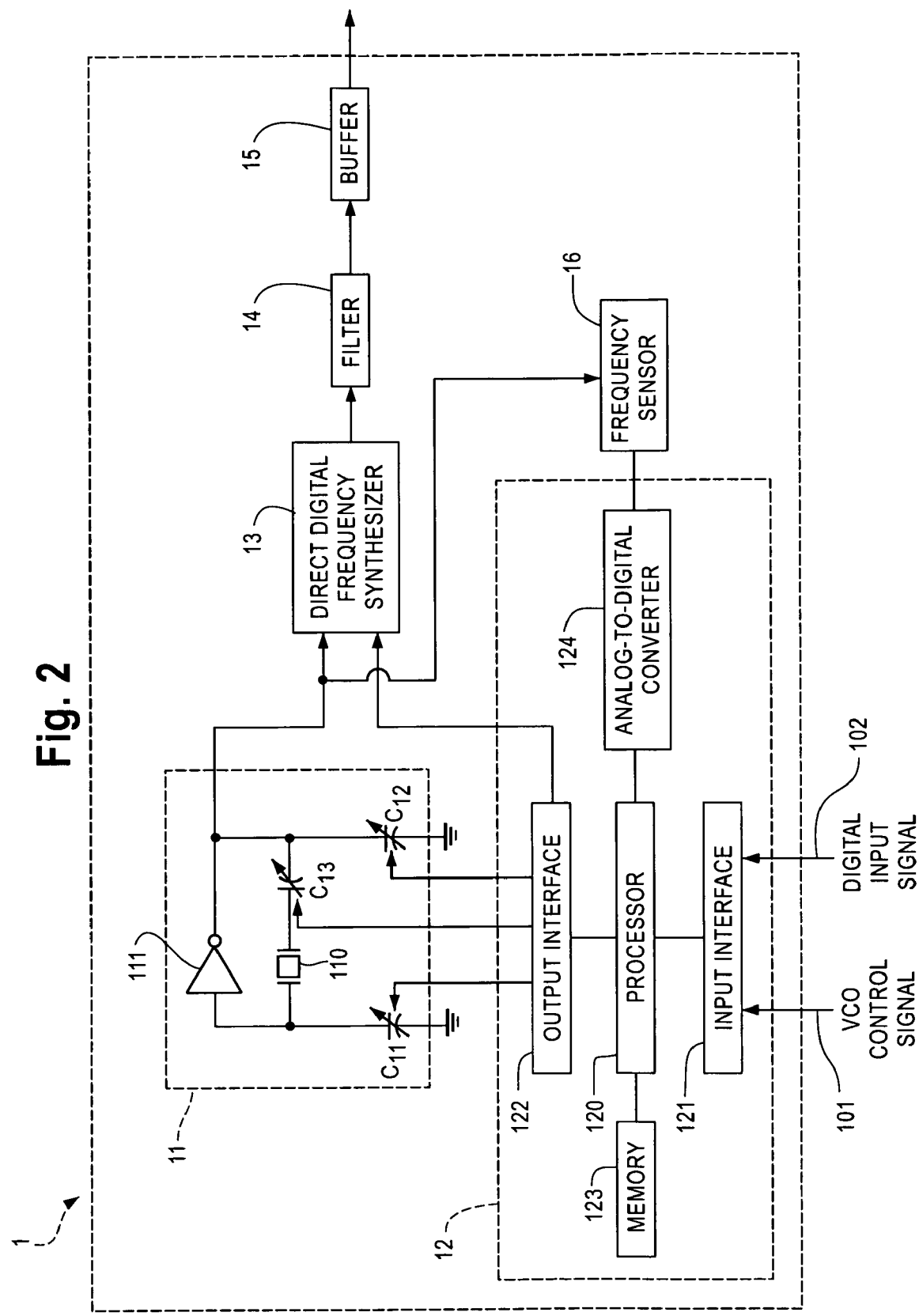
FIG. 2 is a schematic electrical circuit block diagram illustrating the preferred embodiment of a digitally controlled frequency generator according to the present invention.

Referring to FIG. 2, the preferred embodiment of a digitally controlled frequency generator 1 according to the present invention is shown to include an oscillator module 11, a programmable control module 12, a direct digital frequency synthesizer 13, a frequency sensor 16, a filter 14, and a buffer 15.

The oscillator module 11 generates a first clock signal having an oscillating frequency. In this embodiment, the oscillator module 11 includes a crystal resonator 110, and a tuning circuit consisting of an inverter 111 and a plurality of variable load capacitors ($C_{11}$, $C_{12}$, $C_{13}$). Preferably, the oscillating frequency of the first clock signal can meet a predetermined oscillating frequency ($f_{osc}$). However, due to aging, temperature and gravity acceleration factors, the oscillating frequency of the first clock signal generated by the oscillator module 11 is permitted to have a variance with the predetermined oscillating frequency ($f_{osc}$) within a range of the predetermined oscillating frequency ($f_{osc}$)×10 PPM. In other embodiments, the oscillator module 11 can include an oven-controlled crystal oscillator.

The programmable control module 12, such as a PIC24 control module available from MicroChip Technology Corporation, is operable so as to generate a control signal corresponding to a desired frequency ($f_{out}$). In this embodiment, the programmable control module 12 includes an input interface 121, an output interface 122, a memory 123, an analog-to-digital converter 124, and a processor 120 coupled to the input interface 121, the output interface 122, the memory 123 and the analog-to-digital converter 124. The input interface 121 is, operable so as to receive a digital input signal corresponding to the desired frequency ($f_{out}$). The processor 120 receives the digital input signal from the input interface 121, generates the control signal based on the digital input signal and control parameters stored in the memory 123, and outputs the control signal through the output interface 122.

The frequency sensor 16 is coupled to the oscillator module 11 and the analog-to-digital converter 124 of the programmable control module 12. The frequency sensor 16 senses the first clock signal generated by the oscillator module 11 to output a detecting signal to the analog-to-digital converter 124 of the programmable control module 12.

The analog-to-digital converter 124 of the programmable control module 124 receives the detecting signal from the frequency sensor 16, and converts the detecting signal into a digital signal.

The processor 120 receives the digital signal from the analog-to-digital converter 124, and determines a difference between the oscillating frequency of the first clock signal and the predetermined oscillating frequency ($f_{osc}$) based on the digital signal from the analog-to-digital converter 124 and the control parameters stored in the memory 123. It is noted that the difference between the oscillating frequency of the first clock signal and the predetermined oscillating frequency ($f_{osc}$) may be a result of at least one of aging of the oscillator module 11, ambient temperature, and a gravity acceleration of a position where the digitally controlled frequency generator 1 is disposed. The processor 120 outputs an adjusting signal to the oscillator module 11 through the output interface 122 with reference with the detecting signal from the frequency sensor 16, such that the oscillator module 11 adjusts the oscillating frequency of the first clock signal generated thereby to the predetermined oscillating frequency ($f_{osc}$) through tuning of capacitances of the load capacitors ($C_{11}$, $C_{12}$, $C_{13}$) in response to the adjusting signal from the processor 120. Furthermore, preferably, a voltage-controlled oscillation (VCO) control signal is inputted to processor 120 via the input interface 121. Therefore, the processor 120 controls the oscillator module 11 in response to the VCO control signal to stabilize the first clock signal generated by the oscillator module 11.

Figure 3:
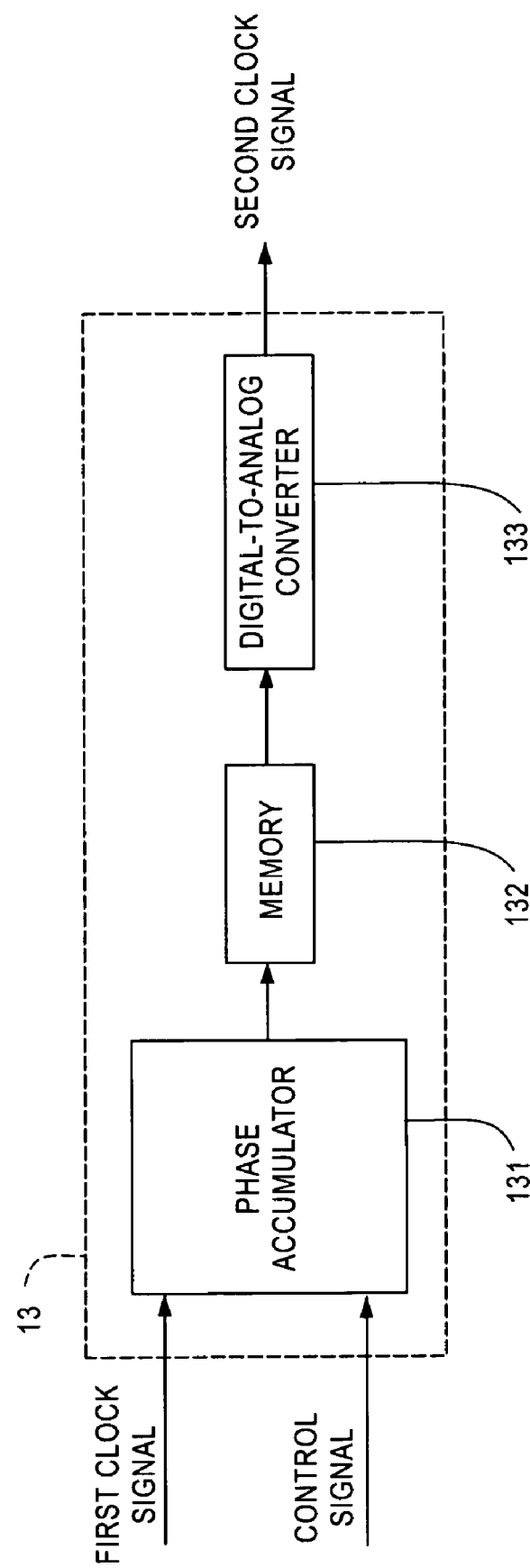
FIG. 3 is a schematic circuit block diagram illustrating a direct digital frequency synthesizer of the preferred embodiment.

The direct digital frequency synthesizer 13 is coupled to the oscillator module 11 and the programmable control module 12 for receiving the first clock signal and the control signal therefrom, and for generating a second clock signal having the desired frequency ($f_{out}$) based on the first clock signal from the oscillator module 11 and the control signal from the programmable control module 12. In this embodiment, referring further to FIG. 3, the direct digital frequency synthesizer 13 includes a phase accumulator 131 coupled to the oscillator module 11 and the output interface 122 of the programmable control module 12, a memory 132 coupled to the phase accumulator 131 for storing a lookup table of phases and amplitudes, and a digital-to-analog converter 133 coupled to the memory 132.

The phase accumulator 131 receives the first clock signal from the oscillator module 11 and the control signal from the output interface 122 of the programmable control module 12, generates a phase signal based on the first clock signal and the control signal, and outputs the phase signal to the memory 132. In this embodiment, the control signal is in the form of a frequency control word.

The phase signal is used to find corresponding amplitudes from the lookup table stored in the memory 132 to synthesize a digital signal having phases and amplitudes. The digital-to-analog converter 133 converts the digital signal into an analog signal that serves as the second clock signal. In this embodiment, the desired frequency ($f_{out}$) of the second clock signal is more than double the predetermined oscillating frequency ($f_{osc}$).

The second clock signal generated by the direct digital frequency synthesizer 13 is filtered by the filter 14 coupled to the direct digital frequency synthesizer 13 to remove undesired components, and is then outputted through the buffer 15 coupled to the filter 14.

In sum, due to the presence of the programmable control module 12 and the direct digital frequency synthesizer 13, the digitally controlled frequency generator 1 of this invention can generate the second clock signal based on the first clock signal generated by the oscillator module 11, where the second clock signal has the desired frequency ($f_{out}$). Furthermore, due to the presence of the frequency sensor 16 and the VCO control signal, the first clock signal generated by the oscillator module 11 can be maintained to have the predetermined oscillating frequency ($f_{osc}$).

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

I claim:

1. A digitally controlled frequency generator comprising:
    an oscillator module for generating a first clock signal having an oscillating frequency;
    a programmable control module operable so as to generate a control signal corresponding to a desired frequency;
    a direct digital frequency synthesizer coupled to said oscillator module and said programmable control module for receiving the first clock signal and the control signal therefrom, and for generating a second clock signal having the desired frequency based on the first clock signal from said oscillator module and the control signal from said programmable control module; and
    a frequency sensor coupled to said oscillator module and said programmable control module, said frequency sensor sensing the first clock signal generated by said oscillator module to output a detecting signal to said programmable control module,
    wherein said programmable control module determines a difference between the oscillating frequency of the first clock signal and a predetermined oscillating frequency based on the detecting signal from said frequency sensor, said programmable control module outputting an adjusting signal to said oscillator module with reference to the detecting signal from said frequency sensor such that said oscillator module adjusts the oscillating frequency of the first clock signal generated thereby to the predetermined oscillating frequency in response to the adjusting signal from said programmable control module.

2. The digitally controlled frequency generator as claimed in claim 1, wherein said programmable control module includes:
    an input interface operable so as to receive an input signal corresponding to the desired frequency;
    an analog-to-digital converter coupled to said frequency sensor for receiving the detecting signal therefrom and for converting the detecting signal into a digital signal; and
    a processor coupled to said input interface and said analog-to-digital converter for receiving the input signal and the digital signal therefrom, for outputting the control signal to said direct digital frequency synthesizer based on the input signal from said input interface, and for outputting the adjusting signal to said oscillator module based on the digital signal from said analog-to-digital converter.

3. The digitally controlled frequency generator as claimed in claim 1, wherein said oscillator module includes one of a crystal resonator and an oven-controlled crystal oscillator.

* * * * *